United States Patent
Henry et al.

(10) Patent No.: US 10,148,244 B1
(45) Date of Patent: Dec. 4, 2018

(54) TRIMMING METHOD FOR MICRORESONATORS AND MICRORESONATORS MADE THEREBY

(71) Applicant: National Technology & Engineering Solutions of Sandia, LLC, Albuquerque, NM (US)

(72) Inventors: Michael David Henry, Albuquerque, NM (US); Janet Nguyen, Wilmington, MA (US); Matt Eichenfield, Albuquerque, NM (US); Roy H. Olsson, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 146 days.

(21) Appl. No.: 15/265,340

(22) Filed: Sep. 14, 2016

Related U.S. Application Data

(60) Provisional application No. 62/218,931, filed on Sep. 15, 2015.

(51) Int. Cl.
*H03H 9/15* (2006.01)
*H03H 9/54* (2006.01)
(Continued)

(52) U.S. Cl.
CPC ..... *H03H 9/02401* (2013.01); *B81C 1/00214* (2013.01); *B81C 99/003* (2013.01); *H03H 3/0075* (2013.01); *H03H 3/0077* (2013.01); *H03H 3/013* (2013.01); *H03H 3/02* (2013.01); *H03H 9/15* (2013.01); *H03H 9/205* (2013.01); *H03H 9/462* (2013.01); *H03H 9/467* (2013.01);
(Continued)

(58) Field of Classification Search
CPC .... H03H 3/0075; H03H 3/0077; H03H 3/013; H03H 3/02; H03H 3/04; H03H 2003/027; H03H 2003/0414; H03H 2003/0478; H03H 9/02401; H03H 9/02393; H03H 9/15; H03H 9/205; H03H 9/2405; H03H 9/462; H03H 9/467; H03H 9/54; H03H 2009/02181; H03H 2009/155; B81C 1/00206; B81C 1/00214; B81C 1/00558; B81C 99/003; B81C 2201/0169
USPC .......................................................... 333/188
See application file for complete search history.

(56) References Cited

U.S. PATENT DOCUMENTS

| | | | |
|---|---|---|---|
| 5,976,994 A * | 11/1999 | Nguyen | H03H 9/02401 438/795 |
| 6,169,321 B1 * | 1/2001 | Nguyen | H03H 9/02401 257/528 |

(Continued)

OTHER PUBLICATIONS

Sepulveda et al.; "Resonant Frequency Behavior of Silicon Cantilevers Coated With Nanostructured and Microcrystalling VO2 Films"; IEEE Transactions on Nanotechnology, vol. 9, No. 3, May 2010, pp. 330-334.*

(Continued)

*Primary Examiner* — Barbara Summons
(74) *Attorney, Agent, or Firm* — Mark A. Dodd

(57) ABSTRACT

A micromechanical resonator is disclosed. The resonator includes a resonant micromechanical element. A film of annealable material deposited on a facial surface of the element. In one instance, the resonance of the element can be adjusting by using a feedback loop to control annealing of the deposited film.

20 Claims, 7 Drawing Sheets

(51) Int. Cl.
    *H03H 3/04*    (2006.01)
    *H03H 9/02*    (2006.01)
    *H03H 3/007*   (2006.01)
    *H03H 9/205*   (2006.01)
    *H03H 9/46*    (2006.01)
    *H03H 3/013*   (2006.01)
    *H03H 3/02*    (2006.01)
    *B81C 1/00*    (2006.01)
    *B81C 99/00*   (2010.01)

(52) U.S. Cl.
    CPC ....... *H03H 9/54* (2013.01); *B81C 2201/0169* (2013.01); *H03H 2003/027* (2013.01); *H03H 2009/155* (2013.01)

(56) References Cited

U.S. PATENT DOCUMENTS

| | | | | |
|---|---|---|---|---|
| 9,203,134 | B1* | 12/2015 | Henry | H01P 11/007 |
| 9,584,092 | B2* | 2/2017 | Engelen | H02N 11/00 |
| 9,887,685 | B2* | 2/2018 | Engelen | H03H 9/02393 |
| 2010/0127798 | A1* | 5/2010 | Ayazi | H03H 9/02275 |
| | | | | 333/186 |
| 2012/0091862 | A1* | 4/2012 | Link | H03H 9/02 |
| | | | | 310/365 |

OTHER PUBLICATIONS

Park et al.; "Thermomechanical Properties and Mechanical Stresses of Ge2Sb2Te5 Films in Phase-Change Random Access Memory"; Elsevier Thin Solid Films 517 (2008) pp. 848-852, available online Sep. 13, 2008.*

Merced et al.; "Frequency Tuning of VO2—Coated Buckled Microbridges"; JMEMS Letters Journal of Microelectromechanical Systems, vol. 20, No. 3, Jun. 2011, pp. 558-560.*

Courcimault et al.; "High-Q Mechanical Tuning of MEMS Resonators Using a Metal Deposition—Annealing Technique"; Transducers '05, The 13th International Conference on Solid-State Sensors, Actuators and Microsystems, Jun. 5-9, 2005, pp. 875-878.*

Henry, M.D. et al., Frequency Trimming of Aluminum Nitride Microresonators Using Rapid Thermal Annealing, Journal of Microelectromechanical Systems, vol. 23, No. 3, Jun. 2014, pp. 620-627.

Henry, M.D. et al., Wafer-Level Packaging of Aluminum Nitride RF MEMS Filters, 2015 Electronic Components & Technology Conference, pp. 1331-1337.

* cited by examiner

TRIMMING METHOD FOR MICRORESONATORS AND MICRORESONATORS MADE THEREBY

CROSS-REFERENCE TO RELATED APPLICATION

This application claims priority to U.S. Provisional Patent Application No. 62/218,931, filed on Sep. 15, 2015 under the title, "TRIMMING METHOD FOR MICRORESONATORS AND MICRORESONATORS MADE THEREBY," the entirety of which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The invention relates to the field of microelectromechanical systems (MEMS) and more particularly to microscale mechanical resonators.

BACKGROUND OF THE INVENTION

The term "microresonator," as used herein, refers to a mechanical or electromechanical resonator including a resonant element fabricated on a microscale, i.e., on a scale of micrometers to millimeters. Microresonators have important applications in various fields, including signal processing and sensing. For example, microresonators fabricated from aluminum nitride (AlN) are used in radiofrequency (RF) filters, accelerometers, and sensors. AlN is one example of a piezoelectric material that responds both electrically and mechanically to applied electric signals, and that can be formed into an electroacoustic resonator capable of modifying such signals.

Microscale fabrication techniques are sufficiently developed to afford control over geometrical properties of the resonant element such as its vertical thickness, lateral dimensions, and shape. This is true for AlN resonators as well as for resonators of other compositions, such as silicon. Through the control of such properties, it is possible to engineer the resonant behavior of the element via its elastic and dielectric characteristics.

Thus, for example, an AlN microresonator RF filter having the known structure shown in a schematic perspective view in FIG. 1 is readily designed to have a passband centered at any frequency in the range 30 kHz to 10 GHz and a Q factor as high as 1500 or even more. One typical center frequency useful for RF communications is 22 MHz.

In the figure, element 10 is an AlN resonant element formed on silicon substrate 20. Wing portions 30, 35 of the resonant element are acoustically isolated from the substrate by etching a trench around them which undercuts the resonant element to form void 40 as best seen in cutaway view 50. Metallization pattern 60 conducts input and output signals between external conductors 70 and upper and lower electrode layers (not shown), which are typically formed adjacent the respective upper and lower faces of element 10. The bottom electrode is typically electrically isolated from the silicon substrate by a silicon oxide layer.

Devices such as the RF filter of FIG. 1 are generally fabricated using well-known wafer-scale integrated circuit (IC) microfabrication techniques such as CMOS techniques. Although the design specifications are generally directed to particular desired resonant frequencies, small process variations (such as variations in film and/or metal thickness across the wafer) are likely to produce variations in the resonant frequency from lot to lot and even across a single substrate wafer. Those individual devices that best match the desired frequency can of course be selected from a large lot, but such a practice generally leads to low yields and high unit costs. Hence, there remains a need for methods of finely tuning the fabricated devices so that yields of devices that conform to specifications can be improved, and so that particular tuning requirements can be met with high reliability.

AlN resonant elements can also be formed using an interdigitated electrode structure (referred to as width-extensional resonators). These resonant elements are typically used for 500-3000 MHz type devices.

SUMMARY OF THE INVENTION

We have found a method of finely tuning the fabricated devices so that yields of devices that conform to specifications can be improved, and so that particular tuning requirements can be met with high reliability.

In a broad aspect, our method involves applying a film or films of metal to an acoustically or electroacoustically resonant element to adjust the resonant frequency of the element. Further control over the resonant frequency is afforded by changing the elastic modulus of the metal films using a feedback loop.

Our method is broadly applicable to resonant micromechanical structures of various kinds. In a more specialized aspect, our method applies to piezoelectric resonant elements. In a still more specialized aspect, our method applies to piezoelectric AlN microresonators. Finally, the method can apply to Lamb-wave piezoelectric microresonators.

Accordingly, an embodiment of our invention relates to a method for fabricating a resonant device, comprising depositing one or more metallic layers on at least one surface of a resonant micromechanical element, and annealing the metallic layers. The term "metallic" is meant to include metals, metal alloys, and highly conductive ceramics such as titanium nitride. In embodiments, a layer of titanium nitride (TiN) is deposited and annealed. In embodiments, layers of titanium nitride (TiN), aluminum-copper (Al—Cu), and titanium (Ti) are deposited and annealed.

Another embodiment of our invention relates to apparatus comprising a resonant micromechanical element and a film of titanium nitride deposited on a facial surface of the element.

Definitions

As used herein, the term "about" means+/−10% of any recited value. As used herein, this term modifies any recited value, range of values, or endpoints of one or more ranges.

By "micro" is meant having at least one dimension that is less than 1 mm. For instance, a microresonator structure (e.g., any structure described herein) can have a length, width, height, cross-sectional dimension, circumference, radius (e.g., external or internal radius), or diameter that is less than 1 mm.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

DETAILED DESCRIPTION OF THE INVENTION

AlN microresonators have demonstrated superior performance as passive resonators, filters, and oscillators. As microelectromechanical (MEMS) devices, AlN microresonators reduce packaging size, cost and better performance than other resonators such as SAW and BAW filters. Further, AlN is highly compatible with standard CMOS processing and can be integrated with standard CMOS electronics. One problem with the fabrication of these devices on a wafer scale is the non-uniformity of layers during deposition, planarization, and etching. This variance can cause a large change in the performance of the devices across the wafer, including design of intended frequency. AlN microresonators can be, for example, Lamb wave resonators (also known as contour mode resonators).

The resonant frequency of an AlN microresonator can be tuned and/or trimmed by controlling the stress in a film, comprising one or more layers of TiN and/or aluminum-copper alloy (Al—Cu) that is deposited so as to overlie the upper face of the AlN resonant element. This technique is not limited to AlN microresonators, but instead can be broadly applicable to any of various types of microresonators, including those made from piezoelectric materials, silicon, or other materials. The illustrative AlN microresonator, described in more detail below, is designed to support the propagation of Lamb waves, i.e., oscillations of thin plates. Because this is the physical regime in which the overlying film may have the strongest tuning effect, the techniques described herein can be especially useful for tuning resonators of thickness that is no more than one-half the resonant acoustic wavelength.

The range of film compositions useful for applying our new tuning technique is not limited to TiN and Al—Cu, but instead extends to any annealable material that has appropriate material and processing compatibilities, and has an elastic modulus, a density, and a thermal coefficient for the change in the elastic modulus (CTE) that jointly affect the tuning enough to have practical effect. The term "annealable material" refers to a material whose elastic modulus may be altered by annealing, and which retains at least part of the change when returned to room temperature. However, TiN is of particular interest not only because it has an advantageous combination of elastic modulus, density, and CTE, but also because the state of stress of TiN films is known to undergo a transition from compressive to tensile at a temperature of about 400° C.

Figure 1:
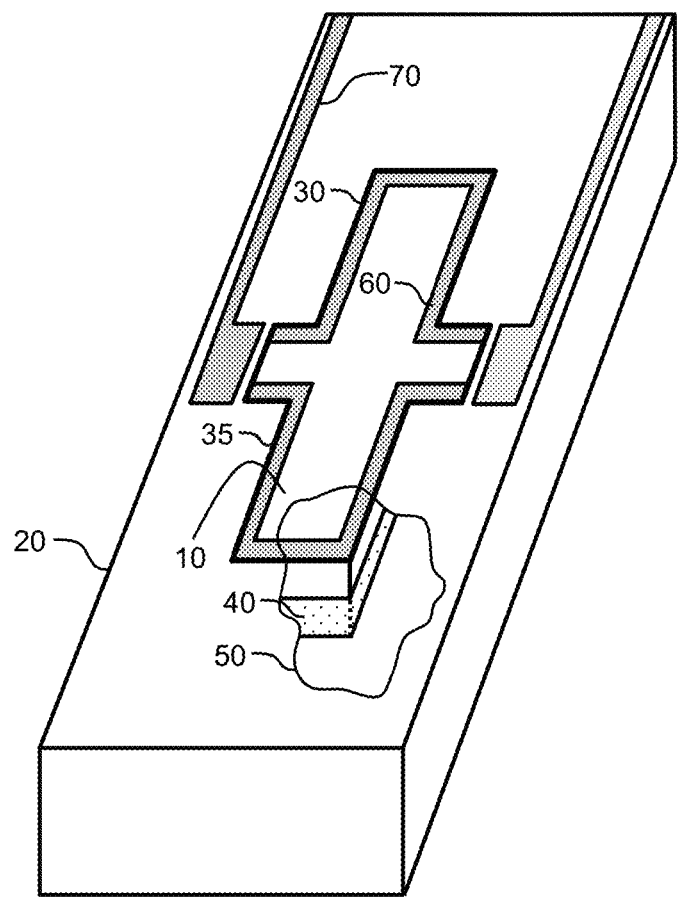
FIG. 1 is a plan view of a known length extensional Lamb Wave AlN microresonator.
Figure 2:
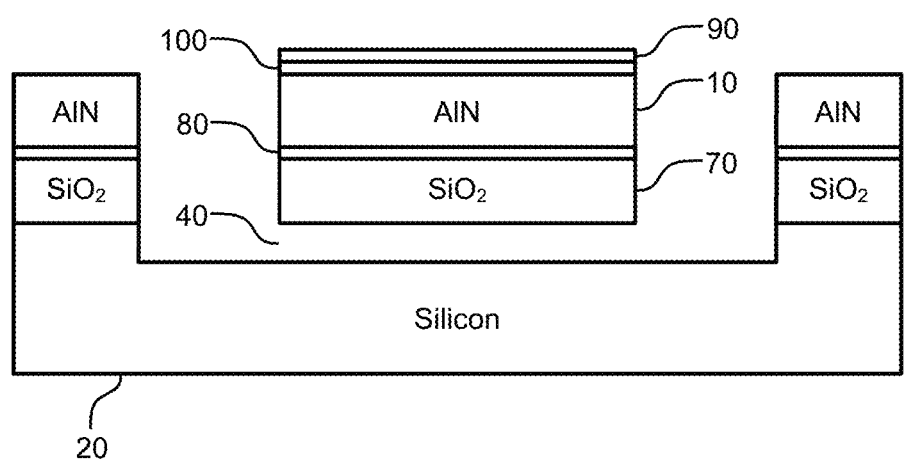
FIG. 2 is a cross-sectional view of an AlN microresonator according to the new method described herein.

FIG. 2 shows, in schematic cross sectional view, an illustrative embodiment of an AlN microresonator similar to that of FIG. 1, with a tuning layer added in accordance with the principles described here. Some details have been omitted from the figure for clarity. Elements common to FIGS. 1 and 2 have been designated by like reference numerals. It will be seen that the arrangement illustrated in FIG. 2 includes a silicon dioxide layer 70, a lower electrode layer 80, and an upper electrode layer 90. Also shown in the figure is tuning layer 100 deposited over resonant element 10.

Wafer-scale fabrication of devices such as those of FIG. 2 can be performed using standard CMOS compatible fabrication techniques, which are well known and need not be described here in detail. In one illustrative wafer-scale procedure for making a plurality of resonators having a nominal center frequency of, e.g., 22 MHz, a silicon dioxide layer and low temperature silicon (Si) release layer are deposited on a silicon wafer of resistivity greater than 5000 Ohm-cm.

The Si release layer is patterned and etched, followed by deposition and planarization of a temperature compensating silicon dioxide layer of thickness 760 nm. This silicon dioxide layer, which forms the bottom of the suspended resonator, provides passive resonator temperature compensation by virtue of its positive thermal coefficient of expansion, which can at least partially offset the negative thermal coefficient of expansion of the AlN piezoelectric material. The silicon dioxide layer is exemplarily formed by a conventional wet oxidation process. Alternatively, it may be deposited by a chemical vapor deposition (CVD) process such as low-pressure CVD or plasma-enhanced CVD.

A bottom resonator electrode metal stack, corresponding to layer 80 of FIG. 2, consists in this illustrative embodiment of Ti (20 nm), TiN (50 nm), and Al—Cu (100 nm). It is deposited on the silicon dioxide layer and patterned by, e.g. plasma etching. This bottom metal stack serves as both a tuning layer and as a conductive contacting layer. The piezoelectric layer of AlN (750 nm) is then sputter deposited on the Al—Cu. This is followed by deposition of the top tuning layer over the piezoelectric layer. For forming the top tuning layer, first Al—Cu (200 nm) is deposited, and then TiN (50 nm). The top tuning layer is then patterned.

More generally, the top tuning layer can be patterned either before or after the patterning of the piezoelectric layer. Moreover, the top tuning layer may also be involved in the creation of electrical contacts. Accordingly, at least some process sequences can include etching holes in the piezoelectric layer, followed by the deposition and patterning of the metal or metals for the top tuning layer.

The AlN piezoelectric layer can be patterned and etched by, e.g., RIE to define the dimensions of the resonator, which in an illustrative embodiment is 180.6 μm wide and 50 μm long, and to open a set of release holes down to the Si release layer. A top metal layer of Au (500 nm) is then deposited on the upper electrode. Last, the resonators are released and suspended by performing an isotropic xenon difluoride (XeF$_2$) dry etch of the silicon release layer. Possible alternatives to XeF$_2$ are silicon hexafluoride (SF$_6$) or nitrogen trifluoride (NF$_3$) which, like XeF$_2$ are selective dry etchants that isotropically etch silicon.

The nominal resonator center frequency $f_o$ can be predicted as follows:

$$f_o = \frac{1}{2W}\sqrt{\frac{\sum E*t}{\sum \rho*t}},$$

wherein W is the resonator width, E is the respective Young's modulus of each of the layers over which the summations are taken, t is the respective thickness of each layer, and ρ is the respective density of each layer. The summations are taken over all layers of the resonant element. It will thus be understood that the sums are respectively a weighted average of the elastic modulus and a weighted average of the density, in which the weight factors are the thicknesses of the respective layers.

It will be understood that because of their thicknesses, the AlN and silicon dioxide layers will dominate the resonator acoustic velocity in the illustrative embodiment described above. However, even relatively thin tuning layers added to the resonator can have a significant effect on the resonant properties.

Resonator center frequencies can be shifted by annealing those resonators that included tuning layers. For example, annealing a 22-MHz resonator having a sputter-deposited 50-nm TiN tuning layer at 400° C. for 25 minutes has increased the resonant frequency by 60 kHz. For example, an anneal time of 5 minutes may be sufficient to reach the new frequency. The new frequency may be unaffected by further annealing at the same temperature. The new frequency appeared to be permanent upon cooling.

Although such an understanding is not essential for the application of the principles described here, the thermal tuning effect may be attributed to changes in the state of stress of the deposited layers induced by heat treatment. Permanently changing the stress state of the tuning layer results in a corresponding shift the effective elastic modulus of the resonator. In general, as the metal heats, the metal stress is relaxed which increases the velocity and the resonant frequency.

The shift in the elastic modulus $E_i$ of the $i^{th}$ layer is usefully modeled according to the linear extrapolation formula:

$$E_i = E_{0i} + c_i(T-25)$$

where $E_{oi}$ is the value of the elastic modulus at room temperature (25° C.) prior to annealing, $c_i$ is a temperature coefficient of the elastic modulus, and T is the annealing temperature in Celsius degrees. In our experiments, annealing was performed by Rapid Thermal Anneal (RTA), although alternatives such as laser heating and even direct conductive heating are not excluded.

For the purpose of modeling an arrangement similar to the illustrative embodiment described above, the AlN and SiO$_2$ layers can be neglected because they are not expected to substantially change their states of stress in the 400° C.-500° C. temperature range that is of primary interest. (The melting point of aluminum is 660° C., which in many cases will impose a practical upper limit on the anneal temperature.) Likewise, the titanium (Ti) adhesion layer can be neglected because it is only 20 nm thick. Thus, to a good approximation, only the Al—Cu and TiN tuning layers need be considered.

By inserting the second of the above equations in to the first and summing over the Al—Cu and TiN layers, the predicted dependence of resonant frequency on anneal temperature can be obtained. The temperature dependence relates to a permanent change in the stress state, and is thus distinct from the type of active temperature compensation seen, for example, when using an oxide layer to counter the negative thermal expansion of AlN.

Values of the parameters needed to calculate the resonant frequency of a microresonator in our illustrative embodiment are provided in Table 1, below. Based on those values, our model predicts a center frequency of 22.4 MHz. In an experiment, the frequencies of 59 resonators arranged across a die wafer were measured. The mean measured frequency was 22.35 MHz, the mean quality factor was approximately 2400, and the mean kt$^2$ was 0.0084. For an anneal temperature of 400° C., our model predicted a frequency upshift of 4271 ppm due to a change in the moduli of the Al—Cu, TiN, and Ti films. The model equation for those three films took the form:

$$f_o = \frac{1}{2W}\sqrt{\frac{E_{AlN}*t_{AlN} + E_{SiO2}*t_{SiO2} + (E_{TiN} + C_{TiN}(T-25))*t_{TiN} + (E_{AlCu} + C_{AlCu}(T-25))*t_{AlCu}}{\rho_{AlN}*t_{AlN} + \rho_{SiO2}*t_{SiO2} + \rho_{TiN} + *t_{TiN} + \rho_{AlCu}*t_{AlCu}}}$$

TABLE 1

|  | Al—Cu | TiN | Ti | SiO$_2$ | AlN |
|---|---|---|---|---|---|
| Elastic Modulus (GPA)- $E_i$ | 51 | 350 | 125 | 73 | 342 |
| Density (kg/m$^3$) - $\rho_i$ | 2700 | 5220 | 4056 | 2200 | 3230 |
| CTE (ppm/C) - $C_i$ | 23.98 | 7.2 | 9.97 | — | — |

Figure 3:
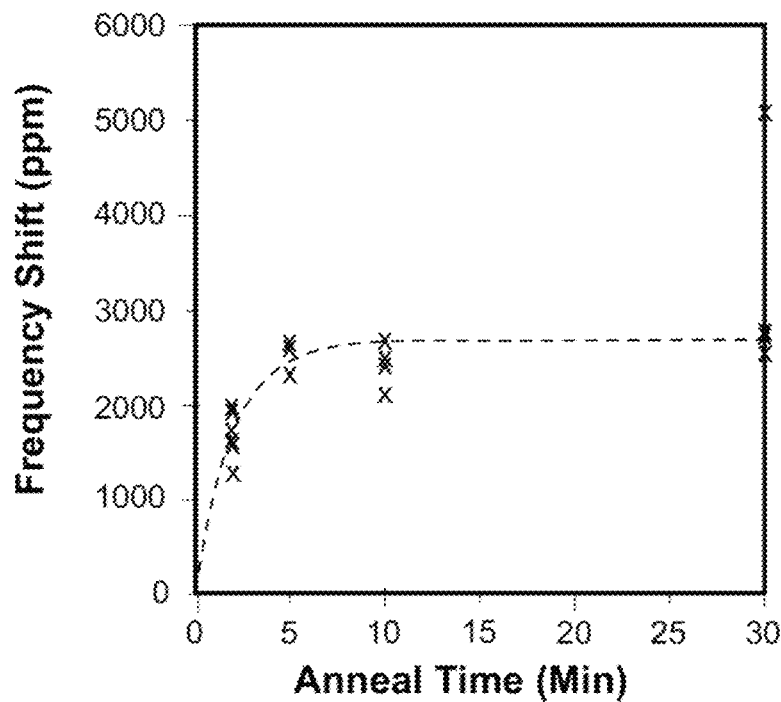
FIG. 3 is a graph of frequency shift versus anneal time for a group of resonators of the kind described herein.

FIG. 3 provides the results of an experiment performed to determine how the frequency shift depends on anneal time in resonators of the kind described above. Designated groups of resonators were purged with argon and then annealed under vacuum by RTA at 400° C. for respective times of 2, 5, 10, and 30 minutes. The center frequencies were measured before and after anneal. All resonator frequencies were observed to shift upward, but saturation was observed at a time of about 5 minutes. The total relative frequency shift was about 2700 ppm.

Figure 4:
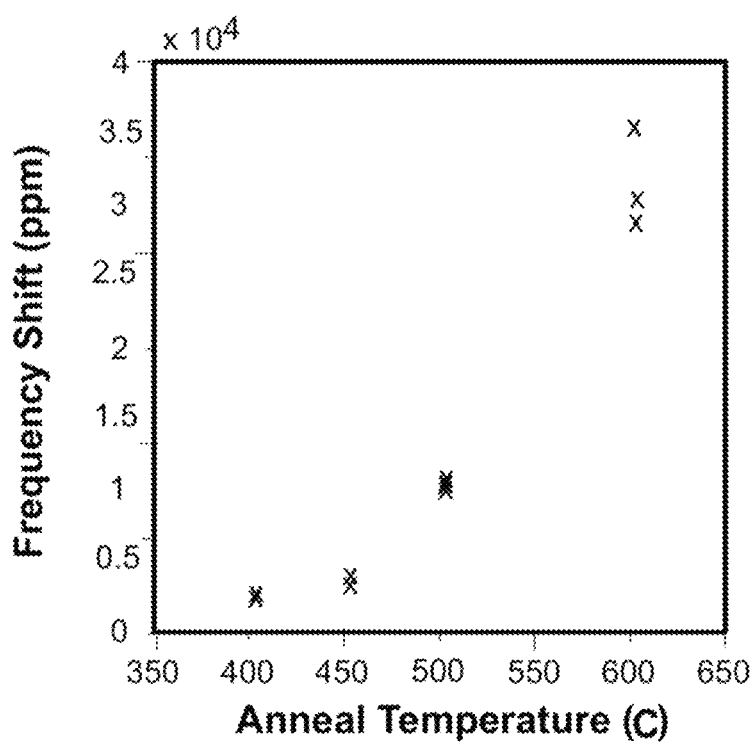
FIG. 4 is a graph of frequency shift versus anneal temperature for a group of resonators of the kind described herein.

FIG. 4 provides the results of an experiment performed to determine how the frequency shift depends on anneal temperature. Again, four designated groups of resonators were annealed for five minutes at respective temperatures of 400° C., 450° C., 500° C., and 600° C. under the same vacuum conditions reported above. The resulting frequency shift had a greater than linear dependence on temperature, with a maximum shift of 30,000 ppm. Only the samples annealed at 600° C. visually displayed adverse effects due to annealing. The damage was observed only on the aluminum layer, and the electrical performance of the resonators was not observed to deteriorate significantly. The 500° C. anneals indicated no damage to the Al metal layer. In resonators of the kind tested, annealing by RTA at 500° C. for 5 minutes can produce a permanent 1.2%, or 12000 ppm, upshift in resonator frequency.

Figure 5:
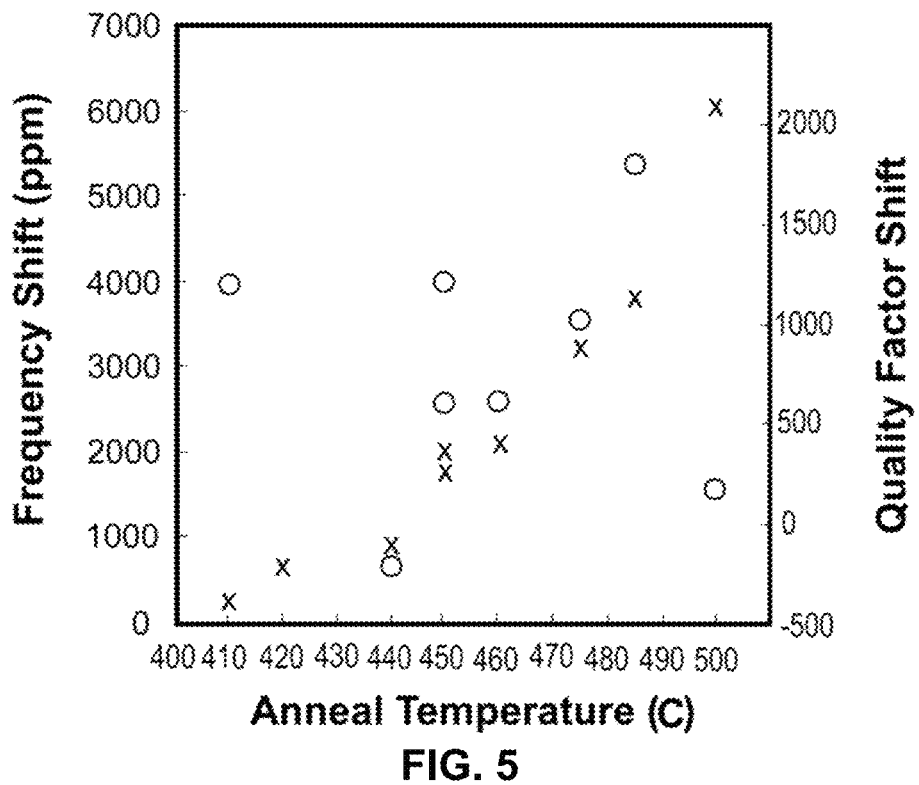
FIG. 5 is a graph of frequency shift ("x" marks in the figure) and of shifts in the resonator quality factor ("o" marks in the figure) versus anneal temperature for a group of resonators fabricated at wafer level as described herein and then encapsulated in a wafer-level packaging (WLP) process.

FIG. 5 provides the results of a further experiment to determine the effect of annealing on the frequency shift ("x" marks in the figure) and on shifts in the resonator quality factor ("o" marks in the figure). Resonators were fabricated at wafer level as described above, and then encapsulated in a wafer-level packaging (WLP) process. In the WLP process, the wafer was subjected to a 25-minute anneal at 400° C., which upshifted the center frequencies of the nominally 22-MHz resonators by about 50-60 kHz.

The wafer was singulated using a dicing saw, and individual dies were electrically tested for RF performance. Ten dies were selected, beginning at the wafer flat and continuing across through the center of the wafer. Variations in resonator frequency were in the approximate range of 22.3 MHz to 22.6 MHz, thus exhibiting a 1.3% variation across the wafer. Resonator quality factors ranged around 1500 to 2500.

Selected dies were then annealed by RTA for five minutes in an argon-purged vacuum environment at various anneal temperatures, and then measured again for resonant frequency and quality factor. FIG. 5 shows the shifts produced by the five-minute anneal, relative to the condition of the resonators after the WLP processing. It will be seen from the figure that the maximum observed frequency shift was about 6000 ppm. The quality factor was seen to improve with increased temperature up to about 485° C.

Figure 6:
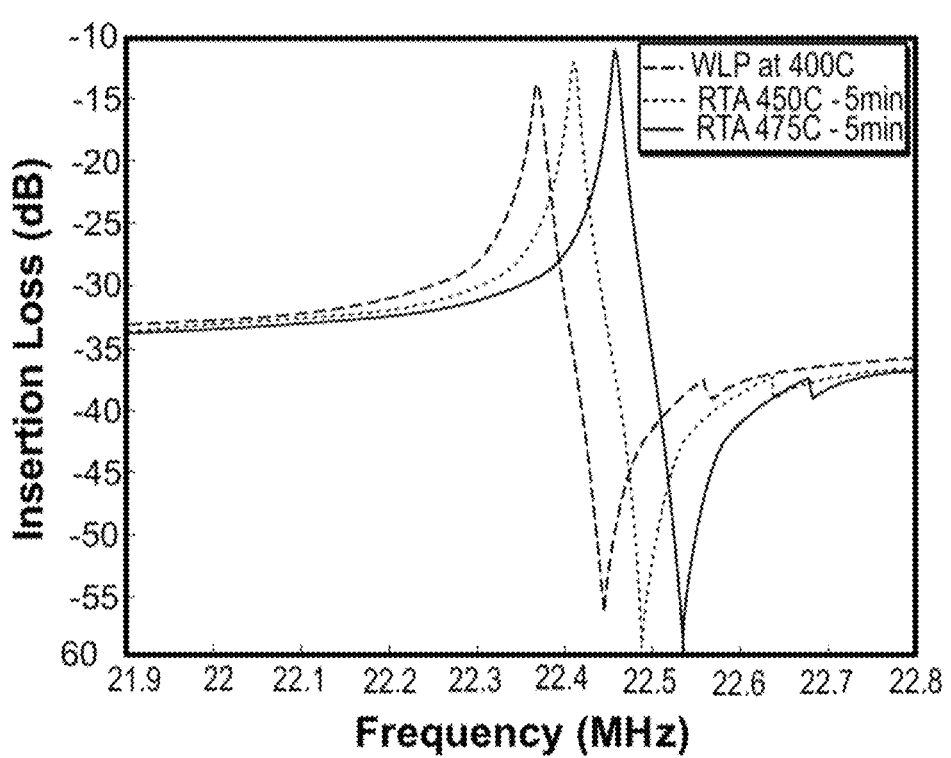
FIG. 6 is a plot of insertion loss versus frequency for a sample resonator at three different stages in the wafer processing. In order from left to right, the stages are: Wafer-level packaging (WLP) heat treatment only; WLP followed by anneal at 450° C.; and WLP followed by anneal at 450° C. and 475° C.

FIG. 6 shows the results of a further experiment to characterize the effect of annealing on resonant behavior. A sample resonator, packaged by WLP, was annealed at 450° C. for 5 minutes and then again at 475° C. for 5 minutes. The figure displays a plot of insertion loss versus frequency for three stages in the processing of the sample wafer; in order from left to right they are: WLP heat treatment only, WLP followed by anneal at 450° C.; and WLP followed by anneal at 450° C. and 475° C. It will be seen upon examination of the figure that annealing the resonator shifted the resonant frequency and also reduced insertion loss and improved the quality factor. The displayed results also suggest that successive anneals at increasing temperatures can be used to successively upshift the resonant frequency.

Small process variations can produce significant variations over the wafer area in the precise resonant frequencies of individual resonators. These variations are generally not entirely random, but instead exhibit spatial correlations. As a consequence, it may be advantageous, in at least some cases, to singulate the wafer into dies and bin the dies into groups requiring the same amount of frequency shift (and hence the same anneal temperature).

Figure 7:
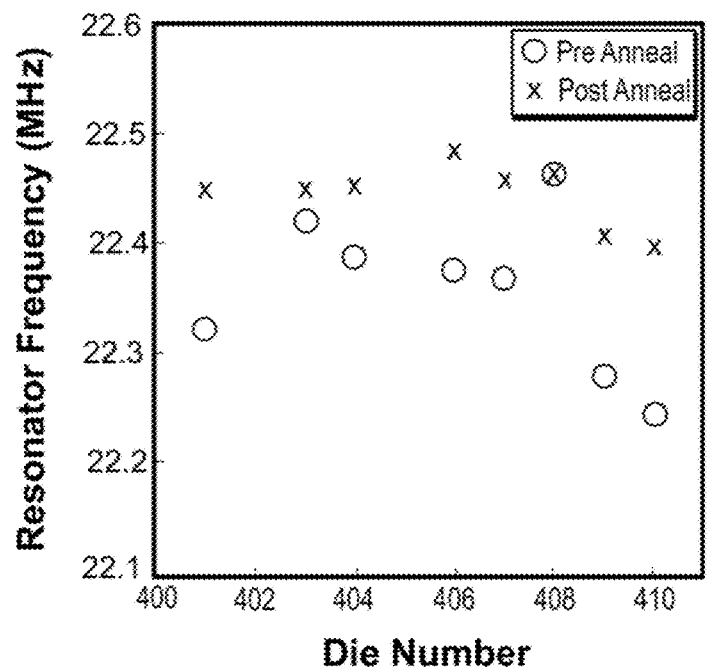
FIG. 7 shows the results of an experiment to determine whether annealing can be used to equalize the center frequencies of resonators formed as a row of dies on a wafer. In the figure, resonator frequency is plotted versus die number for the resonators as evaluated before the corrective annealing step ("o" marks in the figure) and after the corrective anneal ("x" marks in the figure).

FIG. 7 shows the results of an experiment to determine whether annealing can be used to equalize the center frequencies of resonators formed as a row of dies on a wafer. In the figure, resonator frequency is plotted versus die number for the resonators as evaluated before the corrective annealing step ("o" marks in the figure) and after the corrective anneal ("x" marks in the figure).

To obtain the data displayed in FIG. 7, a row of dies was selected from a WLP-processed wafer. Packaged resonators were evaluated across the row, beginning at the wafer flat and continuing across to the wafer top. The following equation:

$$\Delta F = 13.16 \ast (T-400)^2$$

which can be determined by empirical curve-fitting, was then used to determine the appropriate RTA temperature needed to bring each respective die to a common adjusted resonator frequency (see Table 2, below). In the equation, $\Delta F$ represents the frequency shift produced by annealing at temperature T. the targeted frequency was achieved, on average, to an accuracy of about 17 kHz (700 ppm), and the frequency distribution was reduced from 21,700 ppm to 3900 ppm.

The experimental processing conditions and results are summarized in Table 2:

TABLE 2

| Die | Starting Frequency (MHz) | Anneal Temperature (° C.) | Annealed Frequency (MHz) | Predicted Frequency (MHz) | Predicted-Annealed (MHz) |
|---|---|---|---|---|---|
| 0401 | 22.32 | 500 | 22.446875 | 22.4516 | 0.0047 |
| 0403 | 22.41875 | 450 | 22.449375 | 22.448525 | −0.00085 |
| 0404 | 22.386875 | 460 | 22.45 | 22.434251 | −0.015 |
| 0406 | 22.375625 | 475 | 22.4825 | 22.501525 | 0.019025 |
| 0407 | 22.368125 | 475 | 22.456875 | 22.484025 | −0.02715 |
| 0408 | 22.463125 | x | x | x | x |
| 0409 | 22.2775 | 500 | 22.4050 | 22.408475 | 0.003475 |
| 0410 | 22.24375 | 500 | 22.5225 | 22.466600 | −0.0559 |

Figure 8:
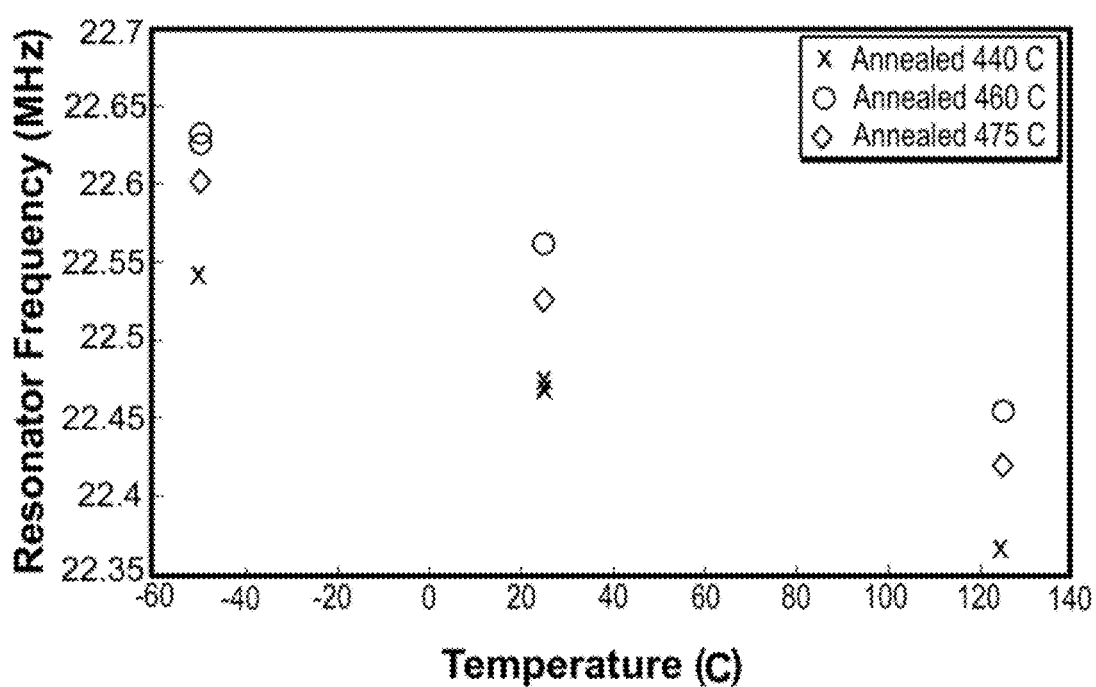
FIG. 8 shows the results of a temperature-cycling experiment to verify that the frequency shifts induced by annealing were permanent. In the figure, we have plotted the resonant frequencies of three resonators at various points in the temperature cycle. The three resonators, which were annealed at different temperatures, are respectively indicated in the figure by "x" marks, "o" marks, and "0" marks.

To verify that the frequency shifts induced by annealing were permanent, a temperature-cycling experiment was performed. The results of the experiment are displayed in FIG. 8. Three dies, annealed at 440° C., 460° C., and 475° C. respectively, were temperature cycled between a minimum temperature of −50° C., room temperature (25° C.), and a maximum temperature of 125° C. while their frequency response was measured. Two temperature cycles, starting at 25° C. and raised to 125° C., were first performed in order to verify post-anneal thermal stability. Thereafter, the devices were subjected to two full temperature cycles (starting at 25° C.) down to −50° C. and then back up to 125° C.

In the figure, the resonant frequencies of three resonators are plotted, respectively indicated by the "x" marks, the "o" marks, and the "0" marks, at various points in the temperature cycle. The resonator indicated by "x" was annealed at 440° C., the resonator indicated by "o" was annealed at 460° C., and the resonator indicated by "0" was annealed at 475° C.

Since the resonators were not fully temperature compensated with the oxide, shifting of the resonator frequency was observed while at the elevated or reduced temperatures. However, no significant hysteresis was observed. This indicated that the resonators could be tuned using the RTA, but the effect is permanent during subsequent operation under standard operating temperatures.

Figure 9:
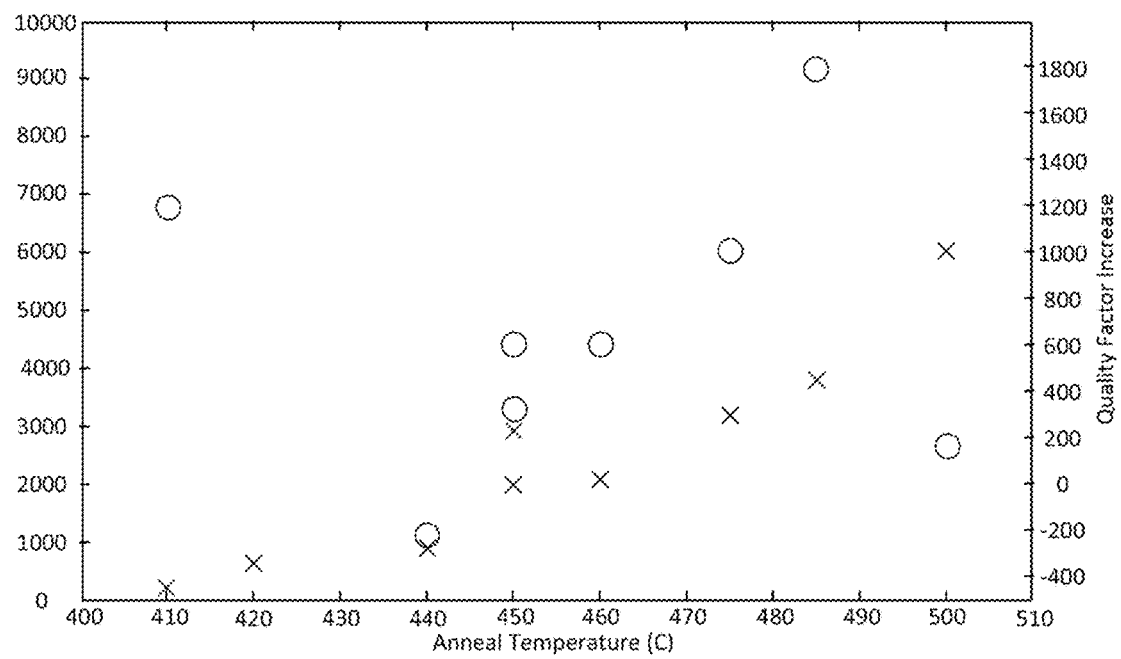
FIG. 9 is a graph illustrating the effect of annealing a resonator.

FIG. 9 is a graph illustrating the effect of annealing a resonator. The 'x' indicates the Frequency-Up Shift in ppm. The 'o' indicates the quality factor increase.

The shift caused by tuning can be approximately 1.5% of the resonator frequency and precise to about 200 ppm. As described above, the temperatures required are typically around 400-550° C. for about 3-5 minutes. The underlying mechanism behind this shift utilizes the metal layers required on the stack. By annealing the metal, the stress and Young's modulus can slightly change in the metal, which will also affect the overall AlN resonator stack's elastic modulus. This change can significantly modify the acoustic propagation in the resonator and hence shift the desired eigenfrequency (or resonant frequency) of the device. Changing the thickness or the type of metal can alter how much of a frequency shift is observed.

Once a resonator has been annealed at a particular temperature (for example 450° C.), the metal has obtained the lower stress state corresponding to the temperature. Accordingly, additional applications of heat at the particular temperature may not substantially further alter the resonant frequency of the resonator. However, subsequent annealing at a higher temperature (for example 500° C.) will further relax the metal and cause a corresponding increase in resonant frequency. This effect can continue for multiple increases in annealing temperature up to the point where heat causes degradation of the material.

Figure 10:
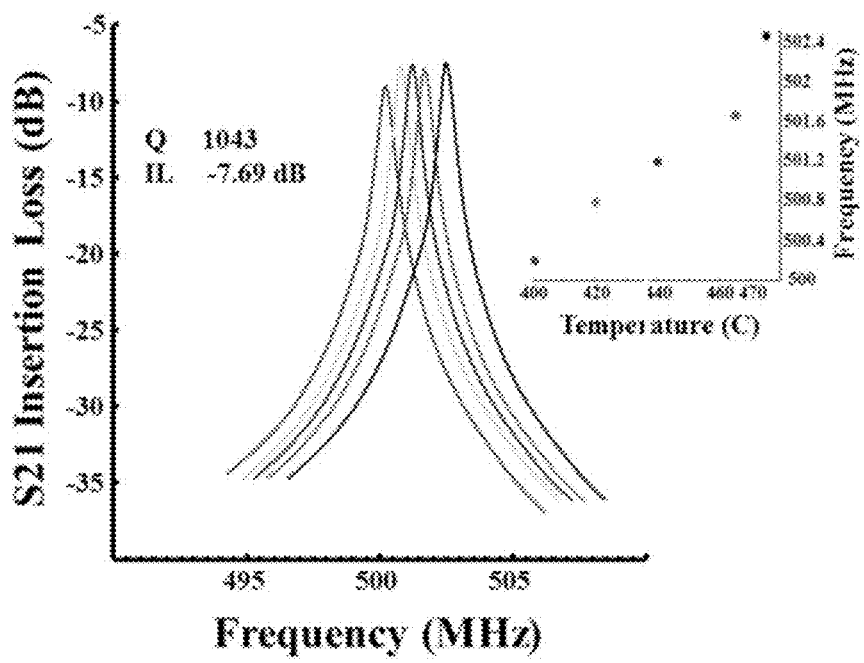
FIG. 10 is a plot of insertion loss versus frequency for a sample width-extension resonator (also referred to as an interdigital transducer (IDT) resonator) at three different stages in the wafer processing. In order from left to right, the stages are: Wafer-level packaging (WLP) heat treatment only; WLP followed by anneal at 420° C., 440° C., 465° C., and 475° C.

Annealing has been shown to be capable of trimming other types of resonators. For example, FIG. 10 is a plot of insertion loss versus frequency for a sample width-extensional resonator (also referred to as an interdigital transducer (IDT) resonator) at three different stages in the wafer processing. In order from left to right, the stages are: Wafer-level packaging (WLP) heat treatment only; WLP followed by anneal at 420° C., 440° C., 465° C., and 475° C.

Figure 11:
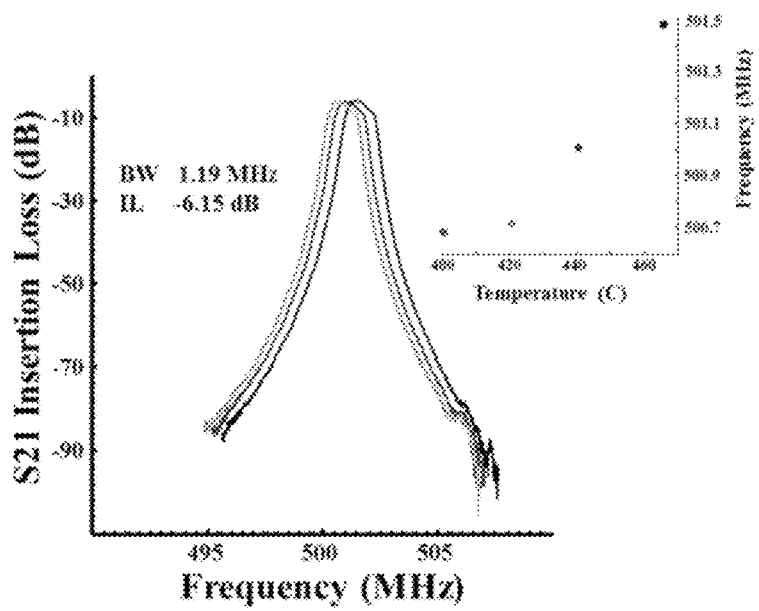
FIG. 11 is a plot of insertion loss versus frequency for a sample filter including multiple resonators at different stages of processing. In order from left to right, the stages are: Wafer-level packaging (WLP) heat treatment only; WLP followed by anneal at 420° C., 440° C., and 475° C.

Filters including multiple resonators can also be trimmed in this manner. FIG. 11 is a plot of insertion loss versus frequency for a sample filter including multiple resonators at different stages of processing. In order from left to right, the stages are: Wafer-level packaging (WLP) heat treatment only; WLP followed by anneal at 420° C., 440° C., and 475° C. The plot of the wafer-level packaging heat treatment only and the plot of WLP followed by anneal at 420° C. are substantially overlapping.

Figure 12:
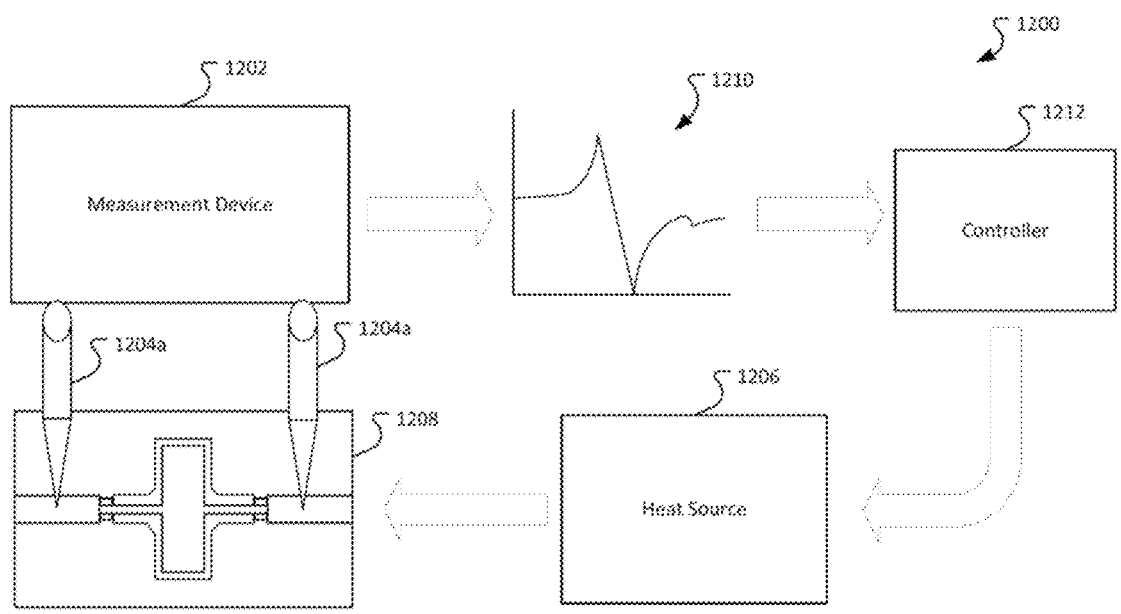
FIG. 12 illustrates an example system using a feedback loop.

A feedback loop can be included to provide more precise control over the annealing process. FIG. 12 illustrates an example of a feedback loop 1200. In general, heating the device anneals the resonator but the precision of the anneal is determined by the accuracy of a heat source (for simplicity the heat source is referred to as an RTA but it could be a laser, RTA, hot plate, oven, etc.). To raise the temperature of the resonator stack, and anneal the metals, a heat flux is applied by the heat source and the temperature of the resonator stack is raised according to Fourier's heat equation. What remain unknown when conventional techniques are applied are all the thermal loss rates and thermal conductivity between the heat source and the resonator. This makes controlled shifting of the resonator frequency difficult and imprecise.

Instead, one could create a heating source 1206 (and/or cooling source) and apply it to the resonator 1208 while actively measuring the resonator frequency. For example, a measurement device 1202 can measure the frequency across the resonator using one or more probes 1204a. Further, the resonator measurement can be applied to a temperature controller for active feedback and increased precision. Heat can be applied to the resonator 1208 while frequency is actively measured. As the desired frequency is approached, the feedback loop controls the heat flux (and hence temperature).

For increased control, a controller 1212 (for example, a proportional integrable differentiator controller) can be utilized in the feedback loop 1200. The controller 1212 receives a signal 1210 from the measurement device 1202. To increase response time and precision, a cooler can also be utilized (so that while a heat source 1206 provides the thermal flux to raise the resonator, the cooler is utilized to pull excess thermal flux, yielding faster control over the temperature).

Multiple heat sources can also possibly be utilized. In some implementations, multiple heat sources can be used to heat different parts of the resonator 1208. For example, a hot plate, oven, or RTA can heat an entire wafer or die, while a laser can be utilized to heat only a specific resonator. Laser heating can also be used to individually tune resonators configured in a filter array. Tuning individual resonators can provide a substantial increase of precision over filter frequency response (up to the margin of error introduced by the control system).

Figure 13:
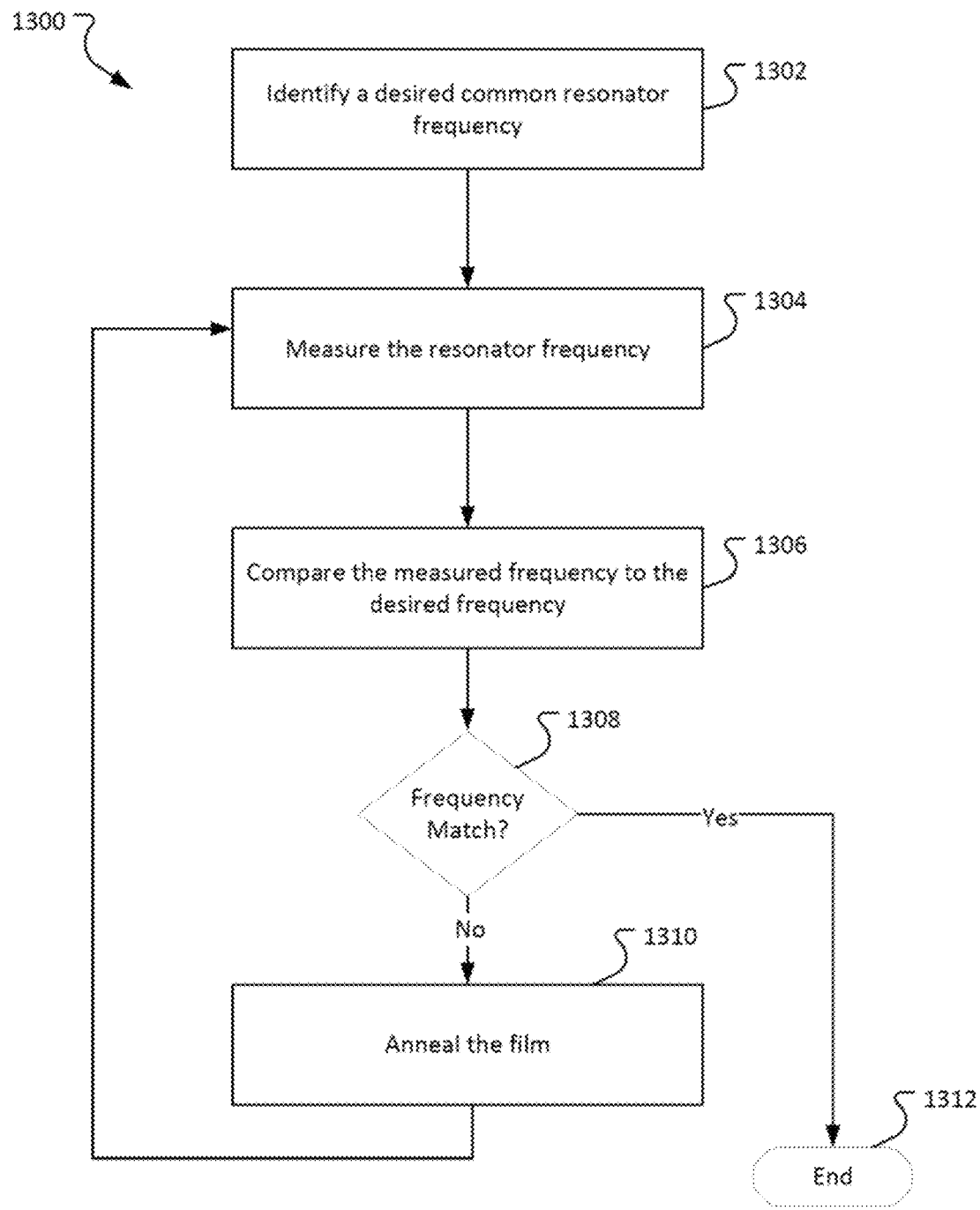
FIG. 13 is a flow chart of an example of a process for shifting the resonant frequency of a resonator.

FIG. 13 is a flow chart of an example of a process 1300 for shifting the resonant frequency of a resonator.

The process 1300 identifies 1302 a desired resonator frequency for the resonator. As discussed above, the resonator may be a micromechanical resonator that has an annealable film depositing on at least one side. The desired resonator frequency can be determined based on external criteria, such as the intended use of the resonator. In some implementations, the desired resonator frequency can be provided to a controller (for example, the controller 1212 of FIG. 12). The process may be performed on a variety of different types of resonators, including but not limited to, length-extensional resonators, width-extensional resonators, and ring resonators.

The process 1300 measures 1304 the resonator frequency. The resonator frequency may be measured by a measuring device (for example, the measurement device 1202 of FIG. 12).

The process 1300 compares 1306 the measured resonator frequency to the desired resonator frequency. If the measured resonator frequency matches the desired resonator frequency 1308 then the process 1300 ends 1312. In some implementations, determining if the measured resonator frequency matches the desired resonator frequency can include determining if the measured resonator frequency is within a predetermined threshold of the desired resonator frequency. The predetermined threshold can be, for example, based on the operational requirements of the resonator and/or a margin of error introduced by the systems implementing the process.

If the measured resonator frequency and the desired resonator frequency do not match 1308, the process 1300 can anneal 1310 the film on the resonator. For example, the process can cause heat to be applied to the resonator as described above.

Once the film has been annealed, the process 1300 can measure 1304 the resonator frequency of the resonator, again. In some implementations, the resonator can be cooled using, for example, a cooling device or a heat sink to speed the cooling process.

While the process 1300 has been described serially, the steps of the process may be performed in parallel. For example, the resonator frequency of the resonator may be continually or intermittently measured while the film is being annealed. In some implementations, a laser may be sent through a top silicon layer on a resonator. The laser can be configured to heat up the annealable film through the silicon layer. (For example, using a 1550 nm wavelength to pass through the silicon layer with zero-dispersion).

In some implementations, the desired common resonator frequency may be adjusted to account for changes in the resonator frequencies due to the increase in temperature of the resonator. In some implementations, the change in frequency of the resonator due to the resonator may be, at least partially, compensated for by a thermal compensating film applied to the resonator (for example, an oxide film).

In some implementations, a resonator may be deliberately manufactured to have a resonant frequency below the desired resonant frequency and then trimmed to the desired resonant frequency (for example, by using the process 1300 described above).

In the illustrative example provided above, the tuning layer consisted of Al—Cu (200 nm) and then TiN (50 nm). Although these dimensions will be typical, a very broad range of thicknesses may be useful depending on specific effects desired. Thus, the total thicknesses of tuning layers may range from a few nanometers to several hundred nanometers, and even to a micrometer or more. One practical limit on the amount of material that may be added in a tuning layer may be imposed by the effect of the total mass on the resonant frequency. Another practical limit may be imposed by the effect of the added thickness on the nature of wave propagation. That is, the tuning layer will be most effective in affecting thin-plate, or Lamb wave, oscillations, for which the total thickness of the vibrating plate is characteristically less than one-half the resonant wavelength. Hence, if the total thickness grows to substantially more than one half wavelength due to the added tuning layer, the thermal tuning effect may be reduced.

Those skilled in the art will appreciate that micromechanical resonators as described above have numerous practical applications, all of which should be understood as included within the scope and spirit of the present invention. One particular practical application is in the field of radiofrequency (RF) filters. Designs for RF filters using piezoelectric micromechanical resonators are known. One advantage of the new ideas presented here is that a new method is provided for tuning such filters. That is, filter characteristics such as the center frequency of a band that is passed or rejected, or the position of a frequency cutoff, or a parameter affecting the shape of a filter response curve, may be adjusted by annealing one or more resonators that are elements of the filter. There is especially great flexibility in the thermal tuning of filters that include multiple micromechanical resonators, because different resonators within the same filter will respond differently to the same heat treatment if they include tuning layers of different designs and/or compositions.

OTHER EMBODIMENTS

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A method for fabricating at least one resonant device, the method comprising:
   identifying a desired common resonator frequency for at least one resonant element, each resonant element having a film of annealable material on at least one surface, each resonant element comprising piezoelectric material; and
   adjusting a resonator frequency of the at least one resonant element using a feedback loop, the feedback loop comprising:
      measuring a first resonator frequency of the at least one resonant element,
      comparing the first resonator frequency to the desired common resonator frequency; and
      based on the comparing, shifting to a second resonator frequency of the at least one resonant element by annealing the film of annealable material at a first temperature, wherein the shifting is toward the desired common resonator frequency.

2. The method of claim 1, wherein the feedback loop is repeated until a measured resonator frequency is within a predetermined threshold of the desired common resonator frequency.

3. The method of claim 1, wherein the second resonator frequency is measured while annealing the at least one resonant element.

4. The method of claim 1, wherein the at least one resonant element is cooled prior to measuring the second resonator frequency.

5. The method of claim 1, wherein the first temperature is increased for each iteration of the feedback loop.

6. The method of claim 1, wherein the annealable material comprises a material whose elastic modulus is altered by annealing and which retains at least part of the change in elastic modulus when returned to room temperature.

7. The method of claim 1, wherein the at least one resonant element includes a plurality of resonant elements arranged in a filter array.

8. The method of claim 7, wherein each resonant element in the plurality of resonant elements is individually annealed using a laser.

9. The method of claim 1, wherein the annealing is applied by a laser.

10. A system comprising:
a heat source configured to anneal at least one resonant element, where the at least one resonant element comprises an annealable film deposited on at least one surface, where the at least one resonant element comprises piezoelectric material;
a measurement device configured to measure a first resonant frequency of the at least one resonant element; and
a controller coupled to the heat source and the measurement device, wherein the controller is configured to control annealing of the at least one resonant element using a feedback loop, the feedback loop comprising:
receiving a measurement of the first resonator frequency of the at least one resonant element,
comparing the first resonator frequency to a desired common resonator frequency; and
based on the comparing, sending a control signal to the heat source to cause the at least one resonant element to shift to a second resonator frequency of the at least one resonant element to about the desired common resonator frequency by annealing the annealable film at a first temperature.

11. The system of claim 10, wherein the controller is configured to repeat the feedback loop until the first resonator frequency is within a predetermined threshold of the desired common resonator frequency.

12. The system of claim 10, further comprising a cooling element configured to cool the at least one resonant element.

13. The system of claim 10, wherein the controller is configured to alter the first temperature for each iteration of the feedback loop.

14. A wafer comprising a plurality of resonant elements and an annealable film deposited on a facial surface of each resonant element,
wherein each of the plurality of resonant elements comprises a common resonator frequency,
wherein the common resonator frequency is configured by using a feedback loop to repeatedly anneal the annealable film at one or more annealing temperatures until each of the plurality of resonant elements resonates at about the common resonator frequency, and
wherein each of the plurality of resonant elements comprises piezoelectric material.

15. The wafer of claim 14, wherein the annealable film comprises titanium nitride and/or an aluminum-copper alloy.

16. The wafer of claim 14, wherein at least one of the plurality of resonant elements is configured to resonate at one or more frequencies associated with Lamb wave propagation in said element.

17. The wafer of claim 14, wherein the one or more annealing temperatures comprises incrementing annealing temperatures.

18. The wafer of claim 14, wherein the plurality of resonant elements comprise a filter.

19. The wafer of claim 14, wherein at least one of the plurality of resonant elements is a width-extensional resonator.

20. The wafer of claim 14, wherein at least one of the plurality of resonant elements is a length-extensional resonator.

* * * * *